United States Patent [19]

Tsukada et al.

[11] 4,368,457
[45] Jan. 11, 1983

[54] ANALOG-TO-DIGITAL CONVERTER

[75] Inventors: Toshiro Tsukada, Kokubunji; Hisashi Tsuruoka, Hachioji; Michio Hara, Kodaira, all of Japan

[73] Assignee: Hitachi Ltd., Tokyo, Japan

[21] Appl. No.: 887,966

[22] Filed: Mar. 20, 1978

[30] Foreign Application Priority Data

Mar. 22, 1977 [JP] Japan .................................. 52/30327

[51] Int. Cl.³ ............................................ H03K 13/20
[52] U.S. Cl. ........................ 340/347 AD; 340/347 NT
[58] Field of Search ... 340/347 M, 347 AD, 347 DA, 340/347 NT; 307/301

[56] References Cited

U.S. PATENT DOCUMENTS

| 3,480,948 | 11/1969 | Lord | 340/347 NT |
| 3,836,906 | 9/1974 | Ando | 340/347 DA |
| 4,023,160 | 5/1977 | Kirschner | 340/347 NT |
| 4,074,260 | 2/1978 | Butler | 340/347 AD |
| 4,083,045 | 5/1978 | Lattin | 340/347 AD |
| 4,097,753 | 6/1978 | Cook | 340/347 AD |
| 4,870,666 | 1/1978 | Butler | 340/347 NT |

OTHER PUBLICATIONS

McCreary "IEEE Journal of Solid State Circuits" Dec. 1975 pp. 371–379.
Smarandoiu "IEEE Journal of Solid–State Circuits" Jun. 1976 pp. 408–410.
Duke "IEEE Trans. on Instrumentation and Measurements" Feb. 1971 pp. 74–76.

Primary Examiner—C. D. Miller
Attorney, Agent, or Firm—Antonelli, Terry & Wands

[57] ABSTRACT

An analog-to-digital converter comprising a capacitive element for storing an analog input signal, a discharge means for discharging the charge stored in said capacitive element, a means for counting the number of clock-pulses between the time of discharge starting and the time at which the voltage at the output of said capacitive element reaches a certain detection level, and a bias voltage supply means for supplying a bias voltage in order to bring the voltage at the output terminal of said capacitive element at the discharge starting time above said detection level.

11 Claims, 15 Drawing Figures

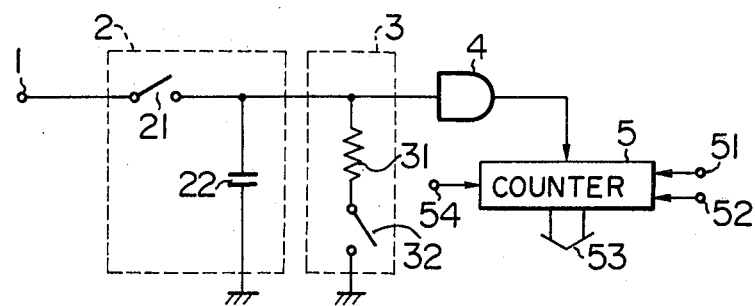
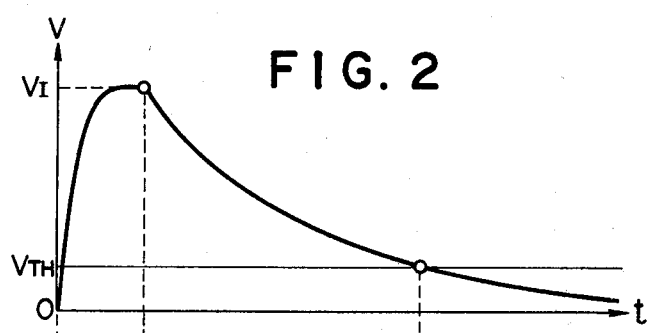

FIG. 3
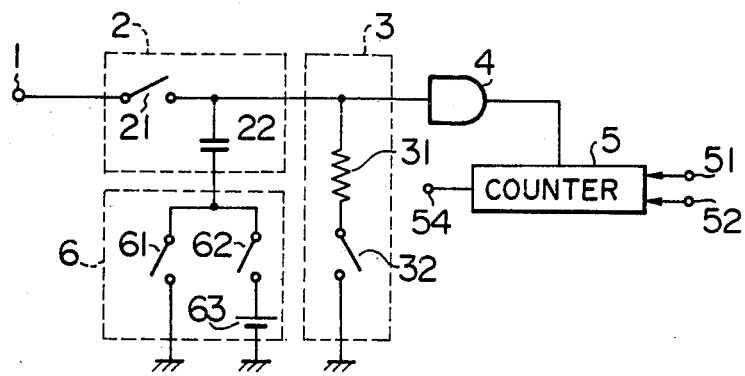
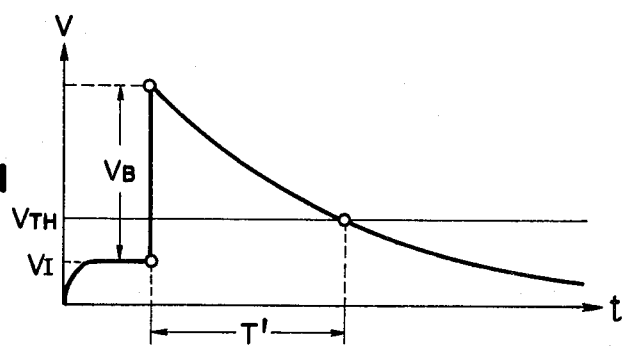
FIG. 4a
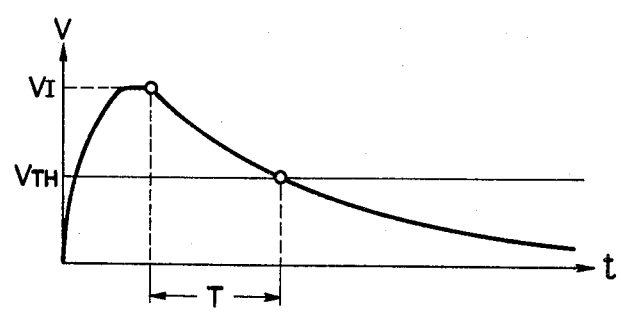
FIG. 4b

F I G. 5a
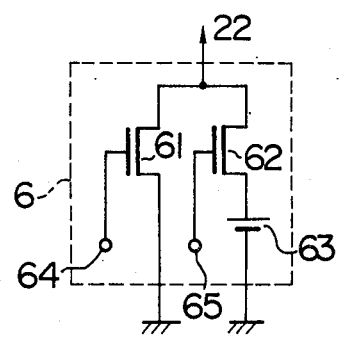
F I G. 5b
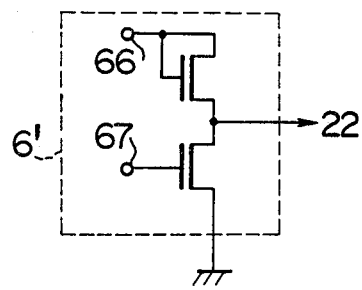
F I G. 6
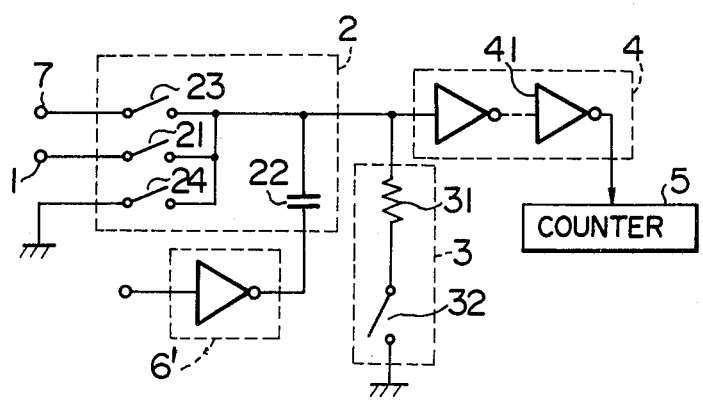

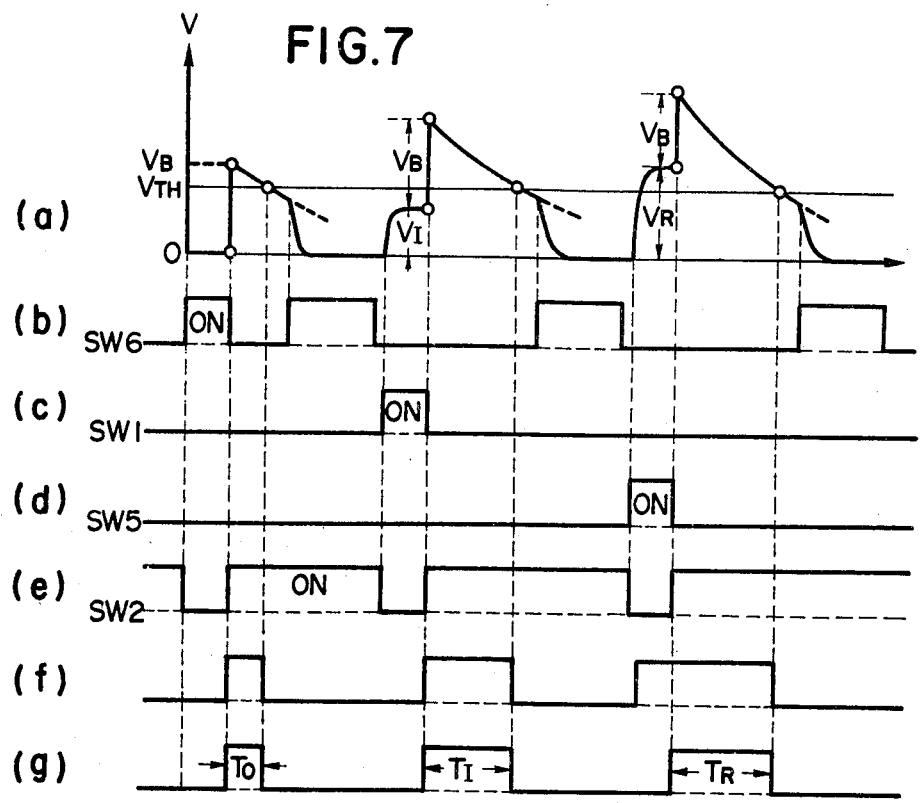
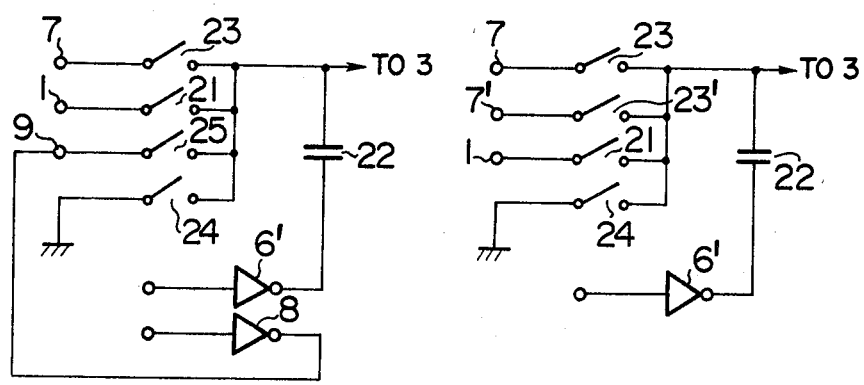

ANALOG-TO-DIGITAL CONVERTER

LIST OF PRIOR ART REFERENCE

The following reference is cited to show the state of the art:

(1) G. Smarandoin et al., "An all -MOS Analog to Digital Converter Using a Constant Slope Approach": IEEE Journal of Solid-State Circuits, June, 1976.

BACKGROUND OF THE INVENTION

1. FIELD OF THE INVENTION

This invention relates to an analog-to-digital Converter (hereinafter referred to as an ADC) which is important for an interface between the analog and the digital circuits, and more particularly to an integrating type ADC as used in the field of welfare equipments, home electric apparatus and instrumentation, etc.

2. DESCRIPTION OF THE PRIOR ART

In a prior art ADC, A-D conversion is done by discharging the charge corresponding to an input signal by a discharging circuit after it is charged in a strorage means, and counting the number of clock pulses by a counter during the discharging time T which is equal to a period that a level of the charge reaches a constant detection level $V_T$. An example is described in an article entitled "An All-MOS Analog to Digital Converter Using a Constant Slope Approach", IEEE Journal of Solid State Circuits, June 1976 by G. Smarandoin et. al.

However, in such a circuit construction of the prior art, if an input signal voltage is less than the detection level $V_{TH}$, the discharge time T cannot be detected, and thus A-D conversion is impossible. In another word, in the prior art circuit, the A-D conversion is possible in a limited range of the input signal.

SUMMARY OF THE INVENTION

One object of this invention is to extend the range of input signal for A-D conversion in an ADC, wherein charges corresponding to an analog input signal are stored in a storage means and then the stored charges are discharged so that a discharge time until a momentarily changing voltage of said storage means reaches a certain detection level is counted by a counter.

Another object of this invention is to provide a circuit construction effective to form an ADC in an IC.

In order to attain these objects, the ADC according to this invention has such a construction that a predetermined bias voltage is connected to the voltage of the storage means (since this voltage is usually equal to an input signal voltage, it is assumed to be the input signal voltage hereinafter) at the discharging to increase the discharge starting voltage and that the discharge time until the discharge voltage reaches said detection level is counted. Thus, even if the input signal voltage is below the detection level $V_{TH}$, the discharge starting voltage is made larger than the bias voltage by a suitable setting of the bias voltage, whereby counting of discharge time or the A-D conversion of a very small analog signal becomes possible.

BRIEF DESCRIPTION OF THE DRAWINGS

FIG. 1 is a drawing showing the schematic circuit construction of the prior art ADC of exponential slope type.

FIG. 2 is a waveform diagram for explanation of the operation of the circuit construction of FIG. 1.

FIG. 3 is a drawing showing the schematic circuit construction of an ADC of exponential slope type according to one embodiment of this invention.

FIGS. 4a and 4b are waveform diagrams for explanation of the operation of the circuit construction of FIG. 3.

FIGS. 5a and 5b are concrete circuit diagrams showing a bias voltage supply means in the circuit construction of FIG. 3.

FIG. 6 is a drawing showing the schematic circuit construction according to another embodiment of this invention.

FIG. 7 is a waveform diagram for explanation of the operation of the circuit diagram of FIG. 6.

FIGS. 8a and 8b are drawings showing the essential portion of a circuit construction improving the embodiment of FIG. 6.

DESCRIPTION OF THE PRIOR ART

Figure 9:
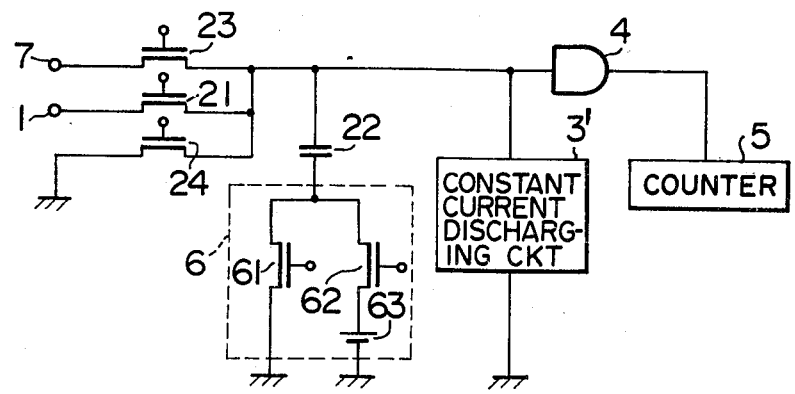
FIG. 9 is a drawing showing the schematic circuit construction of an ADC of constant slope type according to another embodiment of this invention.

Prior to a detailed description of this invention with reference to the drawings, an explanation of an example of the prior art ADC of exponential slope type will be made with FIG. 1. The literature already indicated demonstrating an ADC of constant slope type should be referred to also.

In FIG. 1, 1 denotes an input terminal to which an input signal is supplied, and 2 denotes a storage means comprising a switch 21 (SW1) and a capacitive element 22. 3 denotes a discharging circuit comprising a resistance element 31 and a switch 32 (SW2). 4 is a level detecting circuit and 5 is a counter whose terminals 51, 52 and 54 receive clock pulses to be counted, set and clear pulses respectively.

FIG. 2 is a waveform diagram for explanation of the operation of the circuit construction of FIG. 1. When an input signal voltage $V_I$ is supplied to the input terminal 1 and the switch 21 (SW1) is turned on at a time shown in FIG. 2(b), the output terminal voltage V or the voltage at one terminal of the capacitive element 22 of the storage means 2 becomes equal to the input signal voltage $V_I$. That is, the analog input signal voltage $V_I$ is stored in the storage means. After a time to, when the switch 21 (SW1) is turned off and the switch 32 (SW2) of the discharging circuit 3 is turned on as shown in FIG. 2(c), an electric charge is discharged with an exponential slope through the resistive element 31, as shown in FIG. 2(a). When the voltage V drops to a constant detection level $V_{TH}$, the level detection circuit 4 is turned off, as shown in FIG. 2(d), giving a reset pulse for the counter 5. Since the set pulse for the counter 5 was applied at the terminal 52 at the discharge starting time or when the switch 32 (SW2) was turned on, the counter 5 counts the number of clock pulses supplied to the terminal 51 during the period $T_I^o$ as shown in FIG.

2(e). After the end of counting, the count value is sent out to a processing circuit as shown by an arrow 53.

Following equations hold for the count value $N_I^o$, the frequency f of clock pulses, the capacitance C of the capacitive element 22, and the resistance R of the resistance element.

$$V_I = V_{TH} \exp(T_I^o/CR), \quad (1)$$

$$N_I^o = fT_I^o = f \cdot CR \cdot \ln(V_I/V_{TH}). \quad (2)$$

As apparent from these equations, if $V_I \leq V_{TH}$, the value of $N_I^o$ becomes zero. That is, in the circuit construction shown in FIG. 1, when the input signal voltage $V_I$ is less than the detection level $V_{TH}$, the output of counter 5 is zero, which means that the A-D conversion is not possible. It is seen therefore that the A-D conversion of the prior art circuit is limited.

This is also the same with an ADC of constant slope type using a constant current circuit in the discharging circuit. Putting the count value $N_{IC}^o$, the period $T_{IC}^o$ and the current value of the constant current circuit $I_o$, we have the following equations corresponding to eqs. (1) and (2).

$$V_I = (I_o/C)T_{IC}^o + V_{TH}, \quad (3)$$

$$N_{IC}^o = (fC/I_o)(V_I - V_{TH}). \quad (4)$$

It is clear that unless $V_I > V_{TH}$ the count value $N_{IC}^o$ is not obtained.

DETAILED DESCRIPTION OF THE INVENTION

FIG. 3 shows the first embodiment of this invention, in which this invention is applied to an ADC of exponential slope type. In the figure, the same reference numeral designates the same element. 6 denotes a bias voltage supply means having a function of connecting a bias voltage $V_B$ to the capacitive element 22. 61 and 62 are switches (SW3) and (SW4) respectively. 63 is a bias voltage source. A parallel circuit comprising the switch 61 or (SW3), the switch 62 or (SW4) and the bias voltage source 63 is connected in series with the capacitive element 22.

Explanation will be made of the operation of the embodiment with reference to FIGS. 4a and 4b, showing the waveforms at the output of the storage means 2 of FIG. 3. FIG. 4a shows the waveform when the input signal voltage $V_I$ is less than the detection level voltage $V_{TH}$ while FIG. 4b shows the waveform when $V_I$ is larger than $V_{TH}$. In FIG. 4a, under the condition of switch 21 (SW1) on; switch 32 (SW2) off; switch 61 (SW3) on; and switch 62 (SW4) off, an input signal voltage $V_I$ less than $V_{TH}$ is applied at the input terminal 1. Corresponding charge is stored in the capacitive element 22 and the voltage V at the output of the storage means becomes $V_I$. Next, when the switches 21 (SW1) and 32 (SW2) are turned off and on respectively and, at the same time the switches 61 (SW3) and 62 (SW4) are turned off and on respectively to connect a bias voltage $V_B$ to the capacitive element 22 to cause discharging, the voltage V at the output of the storage means 2 is shifted to $(V_I + V_B)$. In this case, the bias voltage $V_B$ should of course satisfy the condition $V_I + V_B > V_{TH}$. The period $T_I$ in which the voltage V at the output of the storage means 2 drops to $V_{TH}$ is counted by a counter 5 to obtain a count value N. Here, the following equations corresponding to eqs. (1) and (2) hold.

$$V_I = V_{TH} \exp(T_I/CR) - V_B, \quad (5)$$

$$N_I = fCR \ln((V_I + V_B)/V_{TH}). \quad (6)$$

Thus, even if the input signal voltage $V_I$ is smaller than $V_{TH}$, the A-D conversion is effected only by adding a bias voltage source with a suitable value and an additional switch. FIG. 4b shows the waveform when the condition of switch 61 (SW3) on; switch 62 (SW4) off is kept at the discharging time since the input signal voltage $V_I$ is larger than $V_{TH}$. It is noted that the waveform of FIG. 4b is entirely the same as that of FIG. 2a.

Although in the above description the bias voltage $V_B$ was connected to the capacitive element 22 prior to the discharging and the voltage V at the output of the storage means 2 was made $(V_I + V_B)$, a bias voltage $V_B$ with $V_B > V_{TH}$ may be connected to the capacitive element 22 before the discharging regardless of whether $V_I$ is less than $V_{TH}$ or not. By this method, the circuit can be easily constructed, because no circuit for discriminating whether $V_I$ is larger or smaller than $V_{TH}$ is necessary.

Next, explanation will be made of effective elements for constructing the embodiment of FIG. 3 in an IC. As the switches (SW1) to (SW4), single channel (n or P channel) MOSFET or C-MOS analog switches may be used. The level detection circuit 4 can be formed by MOSFET, since it works satisfactorily by multistage connection of conventional logic gates such as inverters.

A concrete example of $V_B$, $V_{TH}$, and $V_I$ will be briefly described here. When the level detection circuit 4 is constituted by multistage connections of inverters, $V_{TH}$ may be set at 0.5 V to 1.5 V. If $V_{TH}$ is set around 1.3 V and the bias voltage $V_B$ is set around 2.0 V, all the input signal voltage $V_I$ above 0V can be A-D converted.

FIGS. 5a and 5b show concrete examples of the bias voltage supply means 6 in FIG. 3. In FIG. 5a, the switches 61 (SW3) and 62 (SW4) of FIG. 3 are constituted by MOSFET's, with 64 and 65 being control terminals for them. FIG. 5b shows a bias voltage supply means 6' realized by a conventional inverter of MOSFET's, with 66 and 67 being $V_{DD}$ supply and control terminals respectively. The voltage difference between the low and high levels of the inverter corresponds to the bias voltage $V_B$. Namely, the inverter is at the low level at the charging time while at the high level at the discharging time. Usually, the low level is grounded.

FIG. 6 shows a modification of the embodiment of FIG. 3. In this embodiment, a reference voltage terminal 7 is connected in parallel with the input terminal 1 to which the input signal voltage $V_I$ is supplied, and furthermore switches 23 (SW5) and 24 (SW6) are added to the switch 21 (SW1). Influence of irregularity and age variation of the circuit elements are thus eliminated by the introduction of the reference voltage $V_R$ as one of the input voltages of ADC. In FIG. 6, the level detection circuit 4 is drawn by a multiple connection of inverters 4. The inverters 4 may be those, as shown in FIG. 5b.

Explanation of the operation of the circuit construction of FIG. 6 will be made next with reference to FIG. 7. FIG. 7(a) shows the output voltage V of the storage means 2. FIGS. 7(b), (c), (d), (e) show ON-OFF operations of the switches (SW6), (SW1), (SW5) and (SW2) respectively. FIG. 7(f) shows the output of the level detection means 4 while FIG. 7(g) shows the operation timing of the counter 5. Although the application time of bias voltage $V_B$ is not shown, $V_B$ is applied simultaneously with the ON of the switch 32 (SW2) while its application is stopped simultaneously with the ON of the switch 24 (SW6). Initially, when the switch 24 (SW6) is turned on and the zero voltage is A-D converted, the counter 5 gives a count value $N_o$. Next, when the switch 21 (SW1) is turned on and the input voltage $V_I$ is A-D converted, the counter 5 gives a count value $N_I$. Lastly, when the switch 23 (SW5) is turned on and the reference voltage $V_R$ is A-D converted, the counter 5 gives a count value $N_R$. In this case, the following equation hold.

$$0 = V_{TH} \exp(N_o/fCR) - V_B, \quad (7)$$

$$V_I = V_{TH} \exp(N_I/fCR) - V_B, \quad (8)$$

$$V_R = V_{TH} \exp(N_R/fCR) - V_B. \quad (9)$$

From eqs. (7), (8) and (9), we have $$V_I = V_R \frac{\exp \frac{N_I}{\tau}}{\exp\left(\frac{N_R}{\tau}\right) - \exp\left(\frac{N_o}{\tau}\right)} - V_B, \quad (10)$$

$$\tau = f \cdot CR = \frac{N_R - N_o}{\ln(V_R + V_B) - \ln V_B}. \quad (11)$$

Thus, $V_I$ is free from the influence of C, R, and $V_{TH}$.

However, since the bias voltage $V_B$ is obtained from the high level of the inverter, variation of $V_B$ and age variation become serious. FIG. 8 shows the essential portion of a circuit construction solving these problems. FIG. 8a shows a construction which counts a count value $N_B$ corresponding to the bias voltage $V_B$. In comparison with FIG. 5, an inverter 8 with the same characteristic as that of the inverter 6' for the bias voltage supply means, an input terminal 9 to which the high level voltage $V_B'$ is applied, and a switch 25 (SW7) for supplying this voltage to the storage means (2) are added. In this circuit, assuming the count value for $V_B'$ with $V_B' = V_B$ as $N_B$, we have $$V_I = V_R \frac{\exp\left(\frac{N_I}{\tau'}\right) - \exp\left(\frac{N_o}{\tau'}\right)}{\exp\left(\frac{N_R}{\tau'}\right) - \exp\left(\frac{N_o}{\tau'}\right)}, \quad (12)$$

$$\tau' = f \cdot CR = \log_2 e \cdot (N_B - N_o). \quad (13)$$

Thus, the influence of $V_B$ is eliminated. If the variation of $V_B$ and $V_B'$ can not be neglected, the embodiment as shown in FIG. 8b may be useful, in which two kinds of reference voltage are used. Let reference voltages $V_R$ and $V_R'$ be applied to the inputs 7 and 7' respectively and count values $N_R$ and $N_R'$ be obtained by the counter 5. Assuming the count values for the input voltage $V_I$ and the zero voltage as $N_I$ and $N_o$ respectively, we obtain $$V_I = V_R \frac{\exp\left(\frac{N_I}{\tau''}\right) - \exp\left(\frac{N_o}{\tau''}\right)}{\exp\left(\frac{N_R}{\tau''}\right) - \exp\left(\frac{N_o}{\tau''}\right)}, \quad (14)$$

where $\tau''$ may be obtained from $$V'_R/V_R = \frac{\exp\left(\frac{N'_R}{\tau''}\right) - \exp\left(\frac{N_o}{\tau''}\right)}{\exp\left(\frac{N_R}{\tau''}\right) - \exp\left(\frac{N_o}{\tau''}\right)}. \quad (15)$$

In FIG. 8b, the switch 23' (SW5') serves to select the reference voltage $V_R'$.

The above description referring to FIGS. 3 to 8 has been made on the embodiments of ADC of exponential slope type. Next, explanation will be made of an embodiment of ADC of constant slope type with reference of FIG. 9. A difference from the exponential slope type is that a constant current discharging circuit 3' is employed as a discharging means. In addition, SW1, SW5 and SW9 are designated to be MOSFET's.

Figure 11:
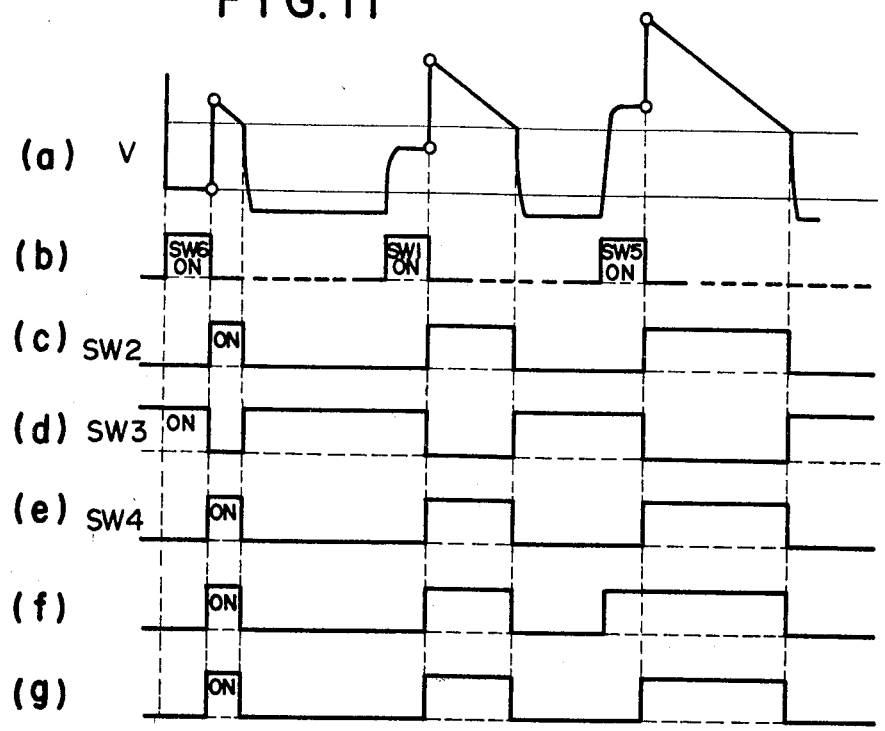
FIG. 11 is a waveform diagram for explanation of the operation of the circuit construction of FIG. 9.

FIG. 11 shows the waveform diagrams of the circuit construction of FIG. 9. FIG. 11(a) shows the voltage V at the output of the storage means 2; FIG. 11(b) shows the ON states of (SW1), (SW5), and (SW6); FIGS. 11(c), (d) and (e) show the ON and OFF states of (SW2), (SW3) and (SW4) respectively; FIG. 11(f) shows the output of the level detection circuit 4; and FIG. 11(g) shows the counting period of the counter 5. Although the times of ON-OFF of switches (SW1) to (SW6) are shown to coincide with each other, the switch 61 (SW3) is turned off a little later than the OFF time of switches 21 (SW1), 23 (SW5) and 24 (SW6). The switch 62 (SW4) is then turned on at a later time, and the switch 32 (SW2) is turned on at a further delayed time. Moreover, it is necessary to provide a certain time gap between the OFF time of switch 62 (SW4) and the On time of switch 61 (SW3). The control of the switch group is done by a signal from a control circuit (not shown).

As apparent from the waveform of FIG. 11(a), when the switches 62 (SW4) and 61 (SW3) are turned off and on respectively, the voltage V at the output of the storage means 2 becomes minues, say $-(V_B - V_{TH})$. If the circuit of this invention is constructed by IC, since the p-n junctions between the substrate and the drain regions of the switches 21 (SW1), 23 (SW5) and 24 (SW6) is forwardly biased, the IC could be destructed due to an excessive current. One desirable method to avoid this is to turn on the switch 61 (SW3) and the switch 24 (SW6) simultaneously after the switch 62 (SW4) is turned off, as shown in the embodiment of FIGS. 6 and 7, to bring the both terminals of the capacitive element 22 to zero voltage.

Denoting the constant current value in the discharging time of the constant current discharging circuit 3' by $I_o$, eqs. (3) and (4) hold. Therefore, the circuit of FIG. 9 operates in accordance with the operation waveform shown in FIG. 11. If the count values for the reference voltage $V_R$, the input signal voltage $V_I$ and the zero voltages $V_o$ are $N_{RC}$, $N_{IC}$ and $N_{DC}$ respectively, we have $$V_I = V_o + (V_R - V_o) \frac{N_{IC} - N_{oC}}{N_{RC} - N_{oC}} \qquad (16)$$

Figure 10:
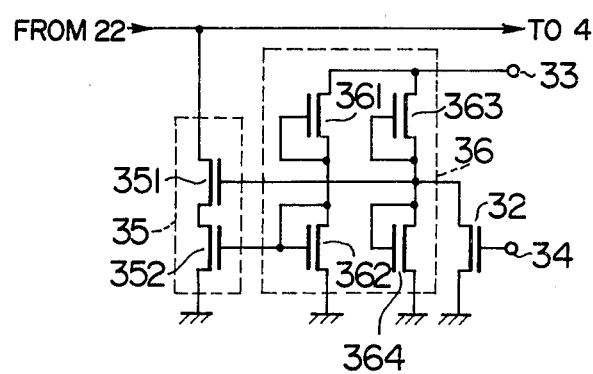
FIG. 10 is a drawing showing the concrete circuit construction of a constant current discharge circuit in the circuit construction of FIG. 9.

In the above equation, C and $V_B$ do not appear. Various kinds of circuits built in an IC are pablicly known. However, as compared with them, the circuit construction as shown in FIG. 10, for example, is favorable, which was filed by the applicant as a specification of Japanese Patent Application No. 87417/77 on July 22, 1977. In FIG. 10, 33 is a $V_{DD}$ supply terminal and 34 is a control terminal for supplying a control pulse to the gate of a MOSFET switch 32 for operating the constant current circuit and discharging it. In the constant current circuit, there is utilized the fact that the drain current in the saturation region of the enhancement type MOSFET is substantially constant independently of the drain voltage. This constant current circuit consists of a constant current output circuit 35 and its bias circuit 36. The constant current output circuit 35 comprises two enhancement type MOSFET's 351 and 352 connected in series between the output terminal and the earth. The bias circuit 36 operates the enhancement type MOSFET's 351 and 352 in the saturation region, and is formed by a first voltage division circuit consisting of the depletion type MOSFET 361 and the enhancement type MOSFET 362 and a second voltage division circuit consisting of the depletion type MOSFET 363 and the enhancement type MOSFET 364. The constant voltage of the first voltage division circuit is applied to the gate of the enhancement type MOSFET 352, while the constant voltage of the second voltage division circuit is applied at the gate of the enhancement type MOSFET 351. These constant voltages are set to operate the enhancement type MOSFET's 351 and 352 in the saturation region. The variation of the voltage at the connection point of MOSFET's 351 and 352 appears opposite to that of the drain currents of them so that the drain voltage of FET 352 becomes always constant, thereby obtaining a constant current circuit of high precision.

Usually, while the discharge circuit of constant slope type is more complicated than that of exponential slope type, count of a required digital value from a count value N is very easy.

Figure 12:
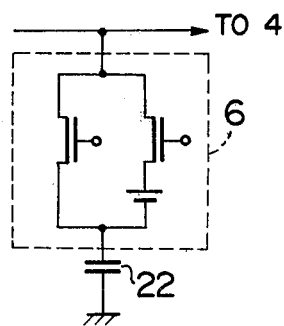
FIG. 12 is a drawing showing the schematic circuit construction of an example of modifying the connection point of the bias voltage supply means used in this invention.

Next, explanation of a modification of the circuit elements in the above embodiments will be made. For the level detection circuit 4, a multistage connection of digital gate circuits such as inverters is most suitably be built in an IC, but the use of analog comparators and operational amplifiers is also favorable. Furthermore, as the connection position of the bias voltage supply means 6, such a position as shown in FIG. 12 is also allowed, as is evident from its function.

We claim:

1. An analog-to-digital converter comprising a storage means connected to an input terminal and storing a signal corresponding to the analog input signal, a discharging means connected to the output terminal of said storage means and discharging said stored signal, and a counter means for counting the number of clock pulses till the time at which the voltage at said output terminal of said storage means reaches a certain detection level during discharging; wherein said analog-to-digital converter further comprises a constant DC bias voltage supply means connected in series with said storage means to shift the voltage at said output terminal of said storage means above said detection level.

2. An analog-to-digital converter according to claim 1; wherein said storage means comprises a first switch one end of which is connected to said input terminal and a capacitive element the one end of which is connected to the other end of said first switch and the other end of which is connected to the earth;

said DC bias voltage supply means being connected in series with said capacitive element.

3. An analog-to-digital converter according to claim 1, wherein said discharging means comprises a series connection of a resistance element and a second switch.

4. An analog-to-digital converter according to claim 2, wherein said DC bias voltage supply means comprises an inverter.

5. An analog-to-digital converter according to claim 2, wherein said DC bias voltage supply means comprises a parallel circuit of a third switch and a series connection of a fourth switch and a bias voltage source.

6. An analog-to-digital converter comprising a storage means for storing an analog input signal voltage applied at an input terminal, a discharging means connected to the output terminal of said storage means and discharging said analog input signal voltage stored in said storage means, a level detection means for detecting the time at which the voltage at the output terminal of said storage means reaches a detection level voltage, and a counter for counting the number of clock pulses from the beginning of discharging to the detection times of said level detection means; wherein said analog-to-digital converter further comprises a constant DC bias voltage supply means connected in series with said storage means to shift the voltage at said output terminal of said storage means above said detection level.

7. An analog-to-digital converter according to claim 6, wherein said level detection means comprises a multistage connection of inverters.

8. An analog-to-digital converter according to claim 7, wherein said storage means comprises a first switch one end of which is connected to said input terminal and a capacitive element the one end of which is connected to the other end of said first switch and the other end of which is connected to the earth; said discharging means comprising a series circuit of a discharging circuit and a second switch inserted between the connection point of said first switch and said capacitive element and the earth.

9. An analog-to-digital converter according to claim 8, wherein said DC bias voltage supply means comprises a parallel circuit of a third switch and a series connection of a fourth switch and a voltage source, and connected in series with said capacitive element.

10. An analog-to-digital converter according to claim 9, wherein said first, second, third and fourth switches comprise an MOSFET.

11. An analog-to-digital converter according to claim 7, wherein said inverter comprises an MOSFET.

* * * * *